United States Patent
Zhu et al.

(10) Patent No.: US 10,892,373 B2
(45) Date of Patent: Jan. 12, 2021

(54) GERMANIUM PHOTODIODE WITH SILICON CAP

(71) Applicant: Newport Fab, LLC, Newport Beach, CA (US)

(72) Inventors: Difeng Zhu, San Diego, CA (US); Edward Preisler, San Clemente, CA (US)

(73) Assignee: Newport Fab, LLC, Newport Beach, CA (US)

( * ) Notice: Subject to any disclaimer, the term of this patent is extended or adjusted under 35 U.S.C. 154(b) by 1 day.

(21) Appl. No.: 16/270,425

(22) Filed: Feb. 7, 2019

(65) Prior Publication Data

US 2020/0259036 A1    Aug. 13, 2020

(51) Int. Cl.
| | |
|---|---|
| *H01L 31/109* | (2006.01) |
| *H01L 31/18* | (2006.01) |
| *H01L 31/028* | (2006.01) |
| *H01L 29/66* | (2006.01) |

(52) U.S. Cl.
CPC ........ *H01L 31/109* (2013.01); *H01L 29/6609* (2013.01); *H01L 31/028* (2013.01); *H01L 31/1804* (2013.01); *H01L 2924/12043* (2013.01)

(58) Field of Classification Search
CPC ....... H01L 2924/12043; H01L 29/6609; H01L 31/028; H01L 31/109; H01L 31/1804
See application file for complete search history.

(56) References Cited

U.S. PATENT DOCUMENTS

| | | | |
|---|---|---|---|
| 9,705,023 B2* | 7/2017 | Yu | H01L 31/107 |
| 9,917,104 B1 | 3/2018 | Roizin | |
| 2010/0084729 A1* | 4/2010 | Steinbrueck | H01L 31/1037 |
| | | | 257/434 |
| 2015/0076642 A1* | 3/2015 | Uedaira | H01L 27/14607 |
| | | | 257/432 |
| 2016/0126381 A1* | 5/2016 | Wang | H01L 31/024 |
| | | | 257/429 |
| 2017/0012143 A1* | 1/2017 | Usami | H01L 31/1808 |
| 2017/0317221 A1* | 11/2017 | Usami | H01L 31/109 |
| 2020/0075792 A1* | 3/2020 | Zhu | H01L 31/1808 |
| 2020/0161364 A1* | 5/2020 | Na | H01L 31/075 |

OTHER PUBLICATIONS

DeRose, C.T., et al. "Ultra Compact 45 GHz CMOS Compatible Germanium Waveguide Photodiode with Low Dark Current." *Optics express*, 19(25), pp. 24897-24904, 2011.
(Continued)

*Primary Examiner* — Joseph C. Nicely
(74) *Attorney, Agent, or Firm* — Farjami & Farjami LLP

(57) ABSTRACT

There are disclosed herein various implementations of a photodiode including a silicon substrate, and an N type germanium region situated over the silicon substrate, the N type germanium region being a cathode of the photodiode. In addition, the photodiode includes a P type germanium region situated over the N type germanium region, the P type germanium region being an anode of the photodiode. The photodiode also includes a P type silicon cap over the P type germanium region, an anode contact of the photodiode situated on the P type silicon cap, and one or more cathode contacts of the photodiode electrically connected to the N type germanium region.

19 Claims, 10 Drawing Sheets

(56) References Cited

OTHER PUBLICATIONS

Masini, G., et al. "High-Performance p-i-n GE on SI Photodetectors for the Near infrared: From Model to Demonstration." *IEEE Transactions on Electron Devices*, 48 (6), pp. 1092-1096, Jun. 2001.
Virot, Léopold, et al., "Integrated Waveguide PIN Photodiodes Exploiting Lateral Si/Ge/Si Heterojunction," Opt. Express 25, pp. 19487-19496 (2017).
Vivien, Laurent, et al., "Zero-bias 40Gbit/s germanium waveguide photodetector on silicon," Opt. Express 20, pp. 1096-1101 (2012).
G. Slovin, et al., "Design Criteria in Sizing Phase-Change RF Switches," in *IEEE Transactions on Microwave Theory and Techniques*, vol. 65, No. 11, pp. 4531-4540, Nov. 2017.
N. El-Hinnawy et al., "A 7.3 THz Cut-Off Frequency, Inline, Chalcogenide Phase-Change RF Switch Using an Independent Resistive Heater for Thermal Actuation," 2013 *IEEE Compound Semiconductor Integrated Circuit Symposium* (*CSICS*), Monterey, CA, 2013, pp. 1-4.

\* cited by examiner

US 10,892,373 B2

GERMANIUM PHOTODIODE WITH SILICON CAP

BACKGROUND

Due to its ability to absorb light in the near infrared, as well as to its compatibility with silicon technology, germanium is desirable for use in the fabrication of high-speed photodiodes. However, germanium is susceptible to damage during several conventional semiconductor processing steps. For example, due to its relatively low melting point in comparison to silicon, germanium tends to deteriorate when exposed to temperatures typically used to anneal silicon. Nevertheless, in the absence of such annealing, the performance of a germanium based device may be undesirably limited by leakage current occurring when the germanium device is reverse biased, also referred to as "dark current."

In addition to the problems described above, germanium can be sensitive to chemicals typically present during silicon processing. For instance, hydrogen peroxide, which is widely used in many clean steps during silicon device fabrication, causes germanium that is exposed to it to dissolve. Consequently, there is a need in the art for new processing strategies enabling the fabrication of high performance germanium based photodiodes having reduced dark current, while protecting those germanium devices from damage during device processing.

SUMMARY

The present disclosure is directed to a germanium photodiode with silicon cap as shown in and/or described in connection with at least one of the figures, and as set forth in the claims.

DETAILED DESCRIPTION

Figure 1:
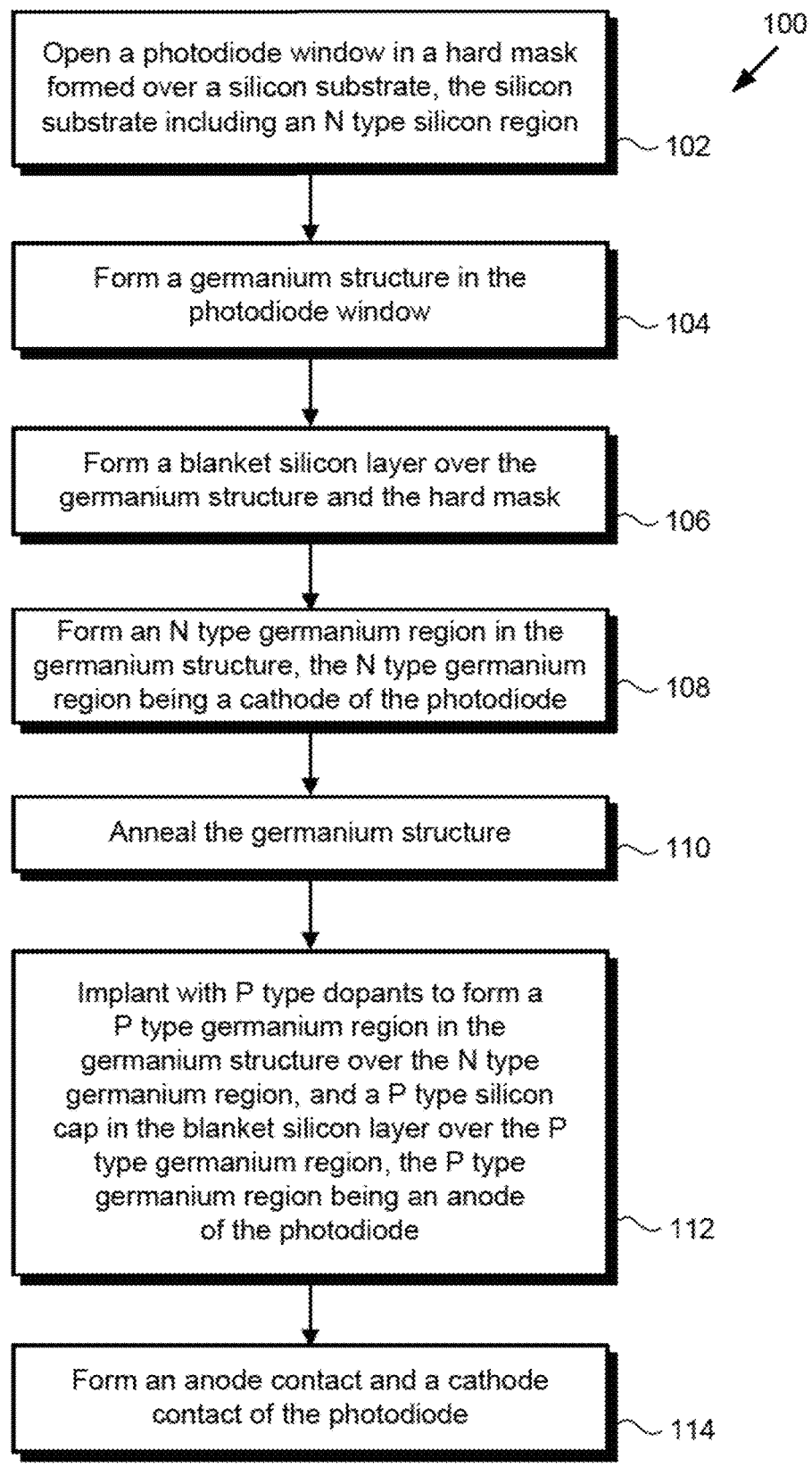
FIG. 1 shows a flowchart presenting an exemplary method for fabricating a germanium photodiode, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, due to its ability to absorb light in the near infrared, as well as to its compatibility with silicon technology, germanium is desirable for use in the fabrication of high-speed photodiodes. However, germanium is susceptible to damage during several conventional semiconductor processing steps. For example, and as also stated above, due to its relatively low melting point in comparison to silicon, germanium tends to deteriorate when exposed to temperatures typically used to anneal silicon. Nevertheless, in the absence of such annealing, the performance of a germanium based device may be undesirably limited by leakage current occurring when the germanium device is reverse biased, also referred to as "dark current." In addition to its sensitivity to heat, germanium can be sensitive to chemicals typically present during silicon processing, such as, hydrogen peroxide, for example, which causes germanium to dissolve.

The present application is directed to germanium photodiodes and methods for their fabrication that address and overcome the problems in the art described above. Such a germanium photodiode includes a silicon cap formed over and providing protection for a germanium structure providing the anode and the cathode of the photodiode. The presence of the silicon cap advantageously protects the germanium structure during annealing, thereby enabling a significant reduction in dark current in the photodiode. In addition, the silicon cap prevents the germanium structure from being exposed to harmful chemicals used during device fabrication. Moreover, the silicon cap, in combination with a silicon substrate of the photodiode, further advantageously enables formation of self-aligned silicided anode and cathode contacts.

FIG. 1 shows flowchart 100 presenting an exemplary method for fabricating a photodiode, according to one implementation. It is noted that certain details and features have been left out of flowchart 100 that are apparent to a person of ordinary skill in the art, in order not to obscure the discussion of the inventive features in the present application.

Figure 2A:
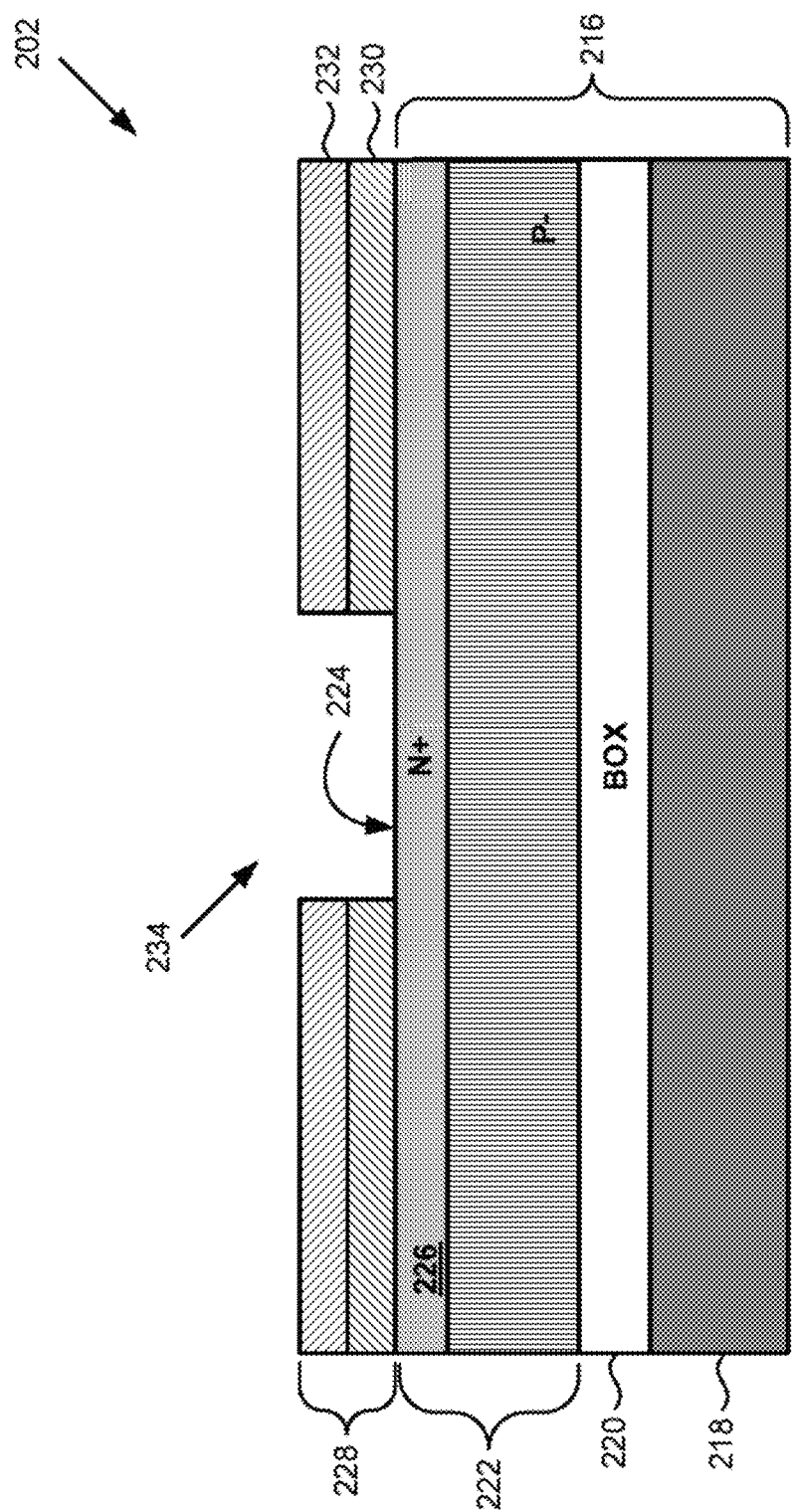
FIG. 2A shows a cross-sectional view of an exemplary structure corresponding to an initial fabrication stage according to the flowchart of FIG. 1.
Figure 2B:
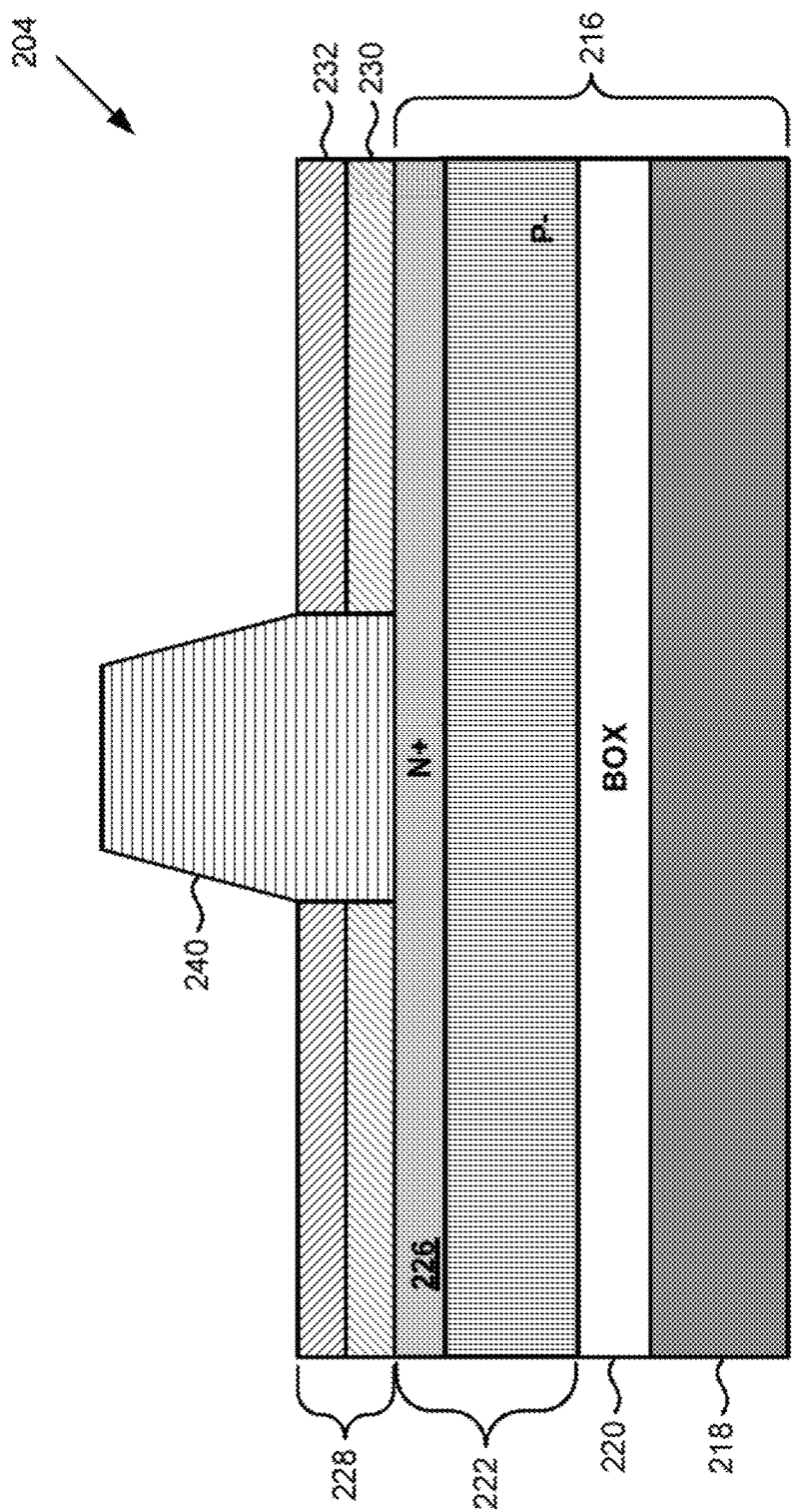
FIG. 2B shows a cross-sectional view of the exemplary structure of FIG. 2A at a subsequent fabrication stage according to the flowchart of FIG. 1.
Figure 2C:
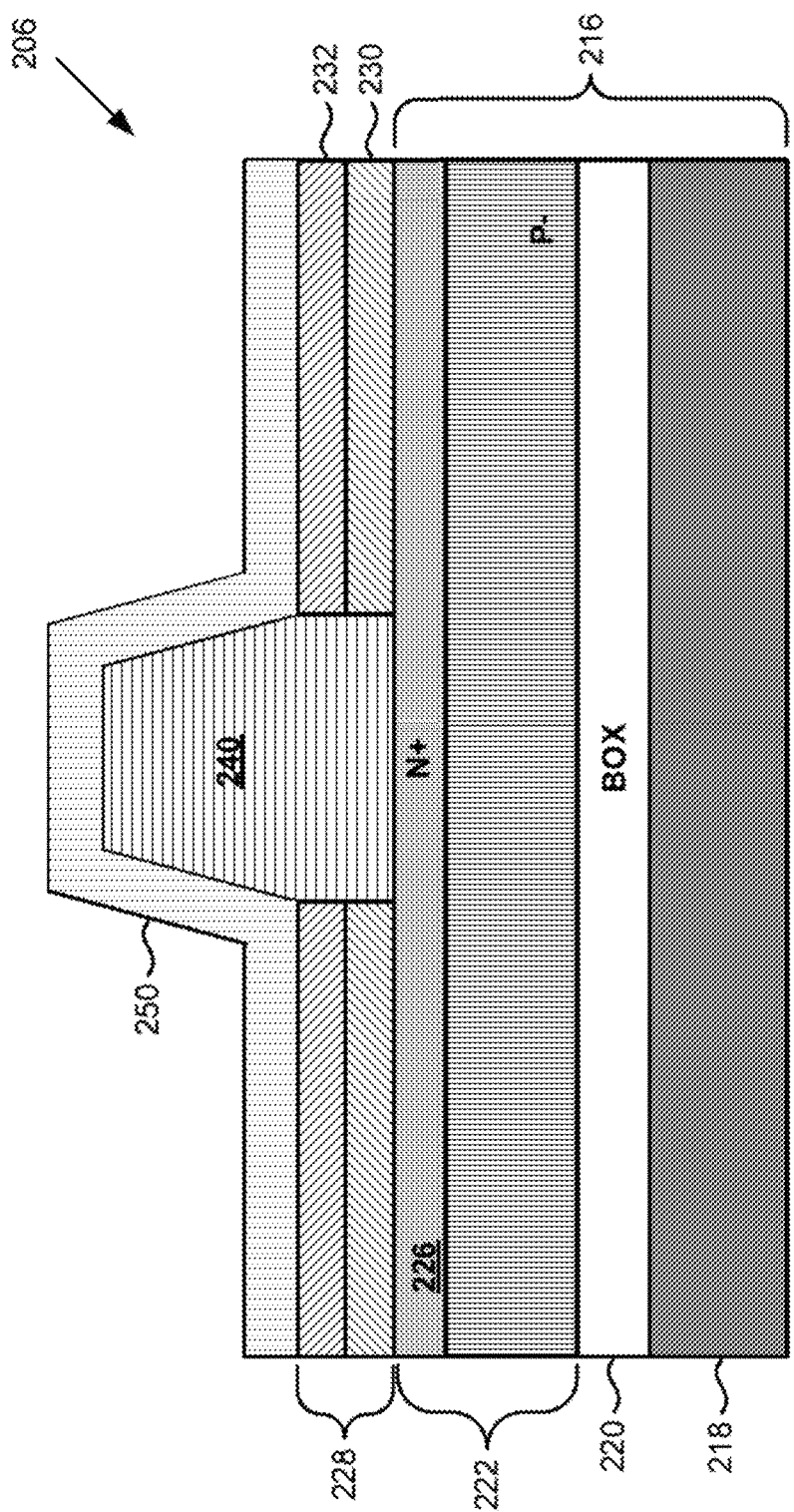
FIG. 2C shows a cross-sectional view of the exemplary structure of FIG. 2B at a subsequent fabrication stage according to the flowchart of FIG. 1.

With respect to FIGS. 2A, 2B, 2C, 2D, 2E, 2F, and 2G (hereinafter "FIGS. 2A-2G"), structures 202, 204, 206, 208, 210, 212, and 214 shown respectively in FIGS. 2A-2G illustrate the result of performing the method of flowchart 100, according to one implementation. For example, structure 202, in FIG. 2A, provides a cross-sectional view of silicon-on-insulator (SOI) body 216 including silicon substrate 222, hard mask 228 disposed over silicon substrate 222 of SOI body 216, and photodiode window 234 opened in hard mask 228 (action 102). Structure 204, in FIG. 2B, is a cross-sectional view of structure 202 after formation of germanium structure 240 in photodiode window 234 (action 104). Structure 206, in FIG. 2C, is a cross-sectional view of structure 204 after formation of blanket silicon layer 250 over germanium structure 240 and hard mask 228 (action 106), and so forth.

It is noted that the cross-sectional structures shown in FIGS. 2A-2G are provided as specific implementations of the present inventive principles, and are shown with such specificity for the purposes of conceptual clarity. Consequently, particular details such as the materials used to form the cross-sectional structures shown in FIGS. 2A-2G, as well as the techniques used to produce the various depicted features, are being provided merely as examples, and should not be interpreted as limitations.

Referring to flowchart 100, in FIG. 1, in combination with FIG. 2A, flowchart 100 begins with opening photodiode window 234 in hard mask 228 disposed over silicon substrate 222 of SOI body 216 (action 102). As shown in the cross-sectional view of FIG. 2A, silicon substrate 222 may be a P type silicon substrate, such as a P− type silicon substrate, having N type silicon region 226 extending from top surface 224 of silicon substrate 222 into an upper portion of silicon substrate 222. However, it is noted that in other implementations, silicon substrate 222 may be N type.

As further shown by structure 202 in FIG. 2A, SOI body 216 includes handle layer 218, which may be a bulk silicon layer, for example, and buried insulator layer 220 shown as an exemplary buried-oxide (BOX) layer situated between handle layer 218 and silicon substrate 222. Thus, silicon substrate 222 may be a top silicon layer of a SOI device fabricated on SOI body 216.

In addition to SOI body 216, structure 202 includes hard mask 228 disposed over silicon substrate 222. In some implementations, hard mask 228 may be formed as a multilayer hard mask including lower dielectric layer 230 formed over silicon substrate 222 and upper dielectric layer 232 formed over lower dielectric layer 230. Also shown in FIG. 2A is photodiode window 234 opened in hard mask 228 and exposing N type silicon region 226 at top surface 224 of silicon substrate 222.

In some implementations, SOI body 216 may be formed by wafer bonding buried insulator layer 220 between handle layer 218 and silicon substrate 222. In some implementations, buried insulator layer 220 may be implemented as a BOX layer, as shown in FIG. 2A, such as a buried silicon dioxide ($SiO_2$) layer. In some of those implementations, SOI body 216 may be formed using a separation by implantation of oxygen (SIMOX) process, for example. In other implementations, buried insulator layer 220 may take the form of any other suitable dielectric, such as sapphire, for example. Thus, in some implementations, SOI body 216 may take the form of a silicon-on-sapphire (SOS) body.

N type silicon region 226 may be formed as a highly doped N+ type region by ion implantation and thermal diffusion prior to formation of hard mask 228 over silicon substrate 222. For example, phosphorous (P) or arsenic (As) dopants may be implanted into top surface 224 of silicon substrate 222 and diffused to form an N+ type region as N type silicon region 226. For example, in one implementation, N type silicon region 226 may be doped with phosphorous (P) to a dopant concentration of from approximately $10^{18}$ cm$^{-3}$ to approximately $10^{19}$ cm$^{-3}$.

Lower dielectric layer 230 and upper dielectric layer 232 may be formed using any material and any technique typically employed in the art. For example, lower dielectric layer 230 may be formed of $SiO_2$, which may be deposited or thermally grown to produce lower dielectric layer 230. As another example, upper dielectric layer 232 may be formed of silicon nitride ($Si_3N_4$), and, like lower dielectric layer 230, may be deposited or thermally grown.

Photodiode window 234 may be opened in hard mask 228 using any suitable 1o techniques known in the art. For example, in some implementations, plasma etching may be performed to open photodiode window 234 through upper dielectric layer 232 and lower dielectric layer 230. In implementations in which upper dielectric layer 232 is formed of $Si_3N_4$ and lower dielectric layer is formed of $SiO_2$, plasma etching of photodiode window 234 may be performed using one of tetrafluoromethane ($CF_4$), sulfur hexafluoride ($SF_6$), or nitrogen trifluoride ($NF_3$), for example.

Moving to structure 204 in FIG. 2B, with continued reference to flowchart 100, in FIG. 1, flowchart 100 continues with forming germanium structure 240 in photodiode window 234 (action 104). Germanium structure 240 may be selectively formed on silicon substrate 222 within the confines of photodiode window 234, for example. In some implementations, germanium structure 240 may be initially substantially intrinsic (i.e. substantially undoped). Germanium structure 240 may be formed in photodiode window 234 to a thickness of up to approximately four hundred nanometers (400 nm), for example.

The selective formation of germanium structure 240 in photodiode window 234 may be performed using any suitable techniques known in the art. For example, germanium structure 240 may be deposited or epitaxially grown using one of chemical vapor deposition (CVD) or molecular beam epitaxy (MBE). Alternatively, in some implementations, it may be advantageous or desirable to selectively form germanium structure 240 using one of atomic layer deposition (ALD) or low energy plasma-enhanced chemical vapor deposition (LEPECVD).

Referring to cross-sectional structure 206, in FIG. 2C, in one implementation, flowchart 100 may continue with forming blanket silicon layer 250 over germanium structure 240 and hard mask 228 (action 106). In contrast to the selective formation of germanium structure 240 in photodiode window 234, silicon layer 250 is formed non-selectively as a conformal blanket layer over germanium structure 240 and hard mask 228. However, it is noted that blanket silicon layer 250 is formed in situ with respect to formation of germanium structure 240 in action 104. That is to say, formation of germanium structure 240 and formation of blanket silicon layer 240 may occur as a substantially continuous growth process in the same growth chamber.

In some implementations, blanket silicon layer may be formed over germanium structure 240 and hard mask 228 to a thickness of approximately seventy nanometers (70 nm), for example. Blanket silicon layer 250 may be formed using any suitable techniques known in the art. For example, blanket silicon layer 250 may be formed using any one of CVD, MBE, ALD, or LEPECVD.

Figure 2D:
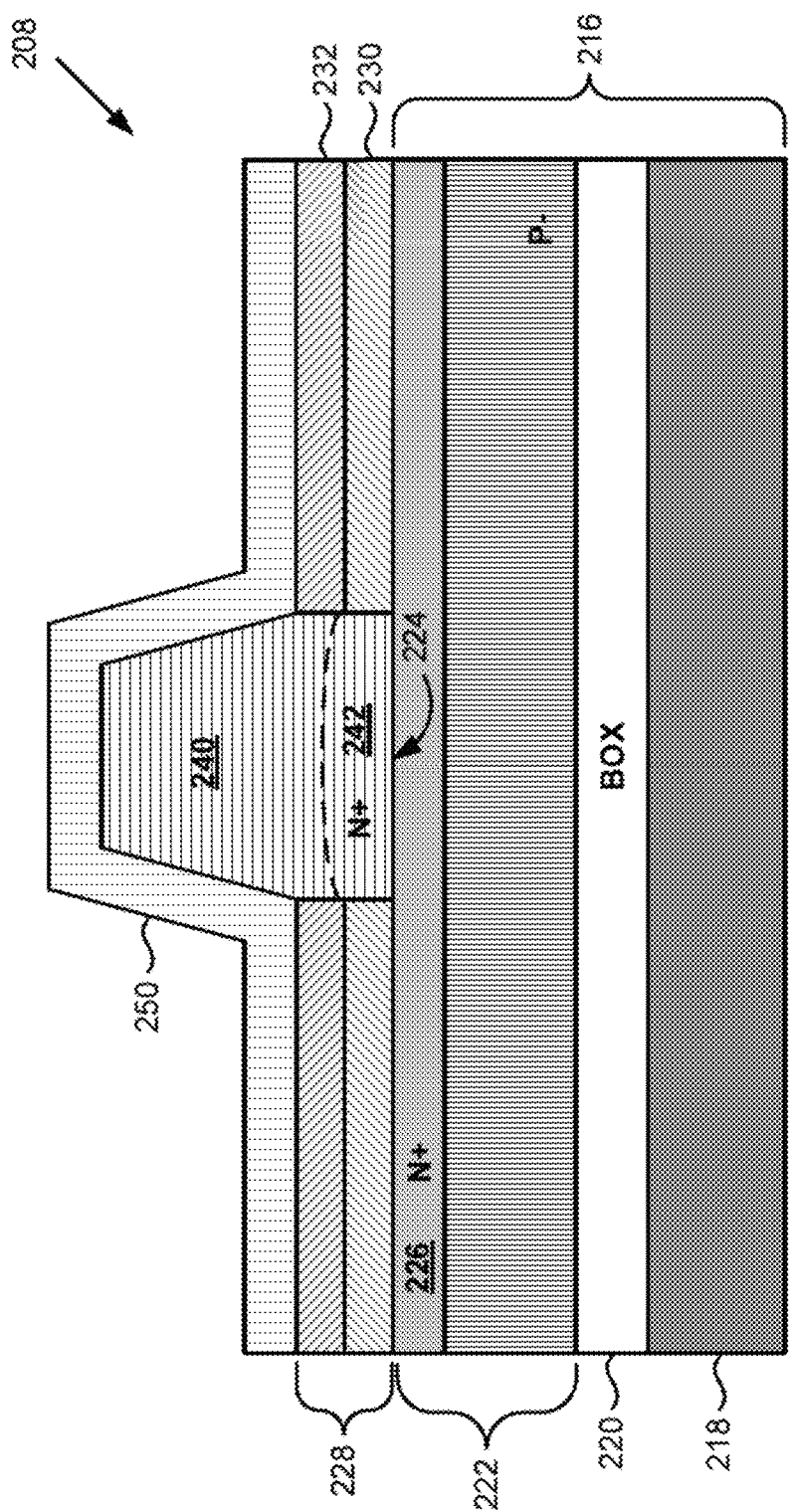
FIG. 2D shows a cross-sectional view of the exemplary structure of FIG. 2C at a subsequent fabrication stage according to the flowchart of FIG. 1.

Moving to structure 208, in FIG. 2D, flowchart 100 continues with forming N type germanium region 242 in germanium structure 240, where N type germanium region 242 will be a cathode of the photodiode (action 108). According to the exemplary implementation shown in FIG. 2D, N type germanium region 242 is a highly doped N+ type region. Formation of N type germanium region 242 in germanium structure 240 may result from diffusion of N type dopants from N type silicon region 226, through top surface 224 of silicon substrate 222, into region 242 of germanium structure 240.

Diffusion of N type dopants from N type silicon region 226 into germanium structure 240 to form N type germanium region 242 may occur at any time during the selective formation of germanium structure 240 and/or the in situ formation of blanket silicon layer 250. In some implementations, N type germanium region 242 may be a highly doped N+ type region, for example, having an N type dopant concentration of from approximately $10^{18}$ cm$^{-3}$ to approximately $10^{19}$ cm$^{-3}$. N type germanium region 242 is a cathode of the photodiode, which can be electrically connected to a cathode contact by various means, as will be discussed further below.

Figure 2E:
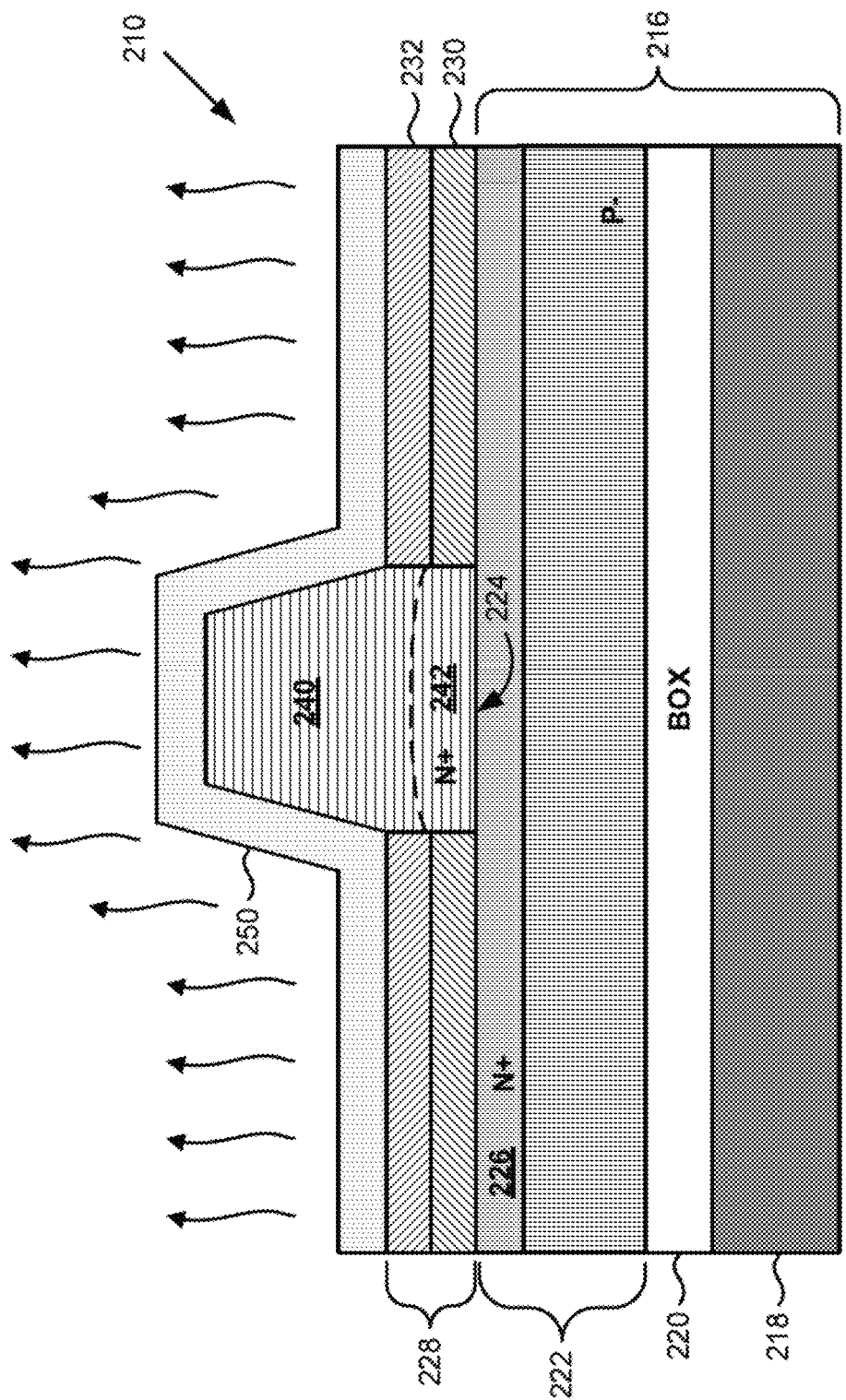
FIG. 2E shows a cross-sectional view of the exemplary structure of FIG. 2D at a subsequent fabrication stage according to the flowchart of FIG. 1.

In some implementations, flowchart 100 may continue with annealing germanium structure 240 in situ after formation of blanket silicon layer 250 (action 110), as shown by structure 210 in FIG. 2E. As noted above, annealing of germanium structure 240 may be performed in situ in the same growth chamber used during formation of germanium structure 240 and blanket silicon layer 250. Annealing of germanium structure 240 may further promote formation of N type germanium region 242 in germanium structure 240 as N type dopants are thermally diffused from N type silicon region 226 into N type germanium region 242. That is to say, in some implementations, the formation of germanium structure 240, the formation of blanket silicon layer 250, and the annealing of germanium structure 240 may be a substantially continuous process performed in situ, during which N type germanium region 242 is formed.

It is noted that formation of blanket silicon layer 250 results in germanium structure 240 being encapsulated. That is to say, germanium structure 240 is adjoined along the entirety of its bottom surface by top surface 224 of silicon substrate 222, along the entirety of its side surfaces by the combination of hard mask 228 and blanket silicon layer 250, and along the entirety of its top surface by blanket silicon layer 250.

The encapsulation of germanium structure 240 resulting from the formation of blanket silicon layer 250 protects germanium structure 240 from thermal damage during annealing. Consequently, and despite the relatively low melting point of germanium, germanium structure 240 may be annealed at a temperature of approximately eight hundred and fifty degrees centigrade (850° C.). Advantageously, annealing of germanium structure 240 in action 110 substantially reduces dark current in a photodiode including germanium structure 240. For example, annealing of structure 210 at a temperature of approximately 850° C. can reduce dark current in a photodiode including germanium structure 240 by almost two orders of magnitude, i.e., from at least ten times to almost one hundred times, when compared to a photodiode in which a corresponding germanium structure is not annealed. In addition, encapsulation of germanium structure 240 prevents exposure of germanium structure 240 to harmful chemicals typically used during semiconductor device fabrication.

Figure 2F:
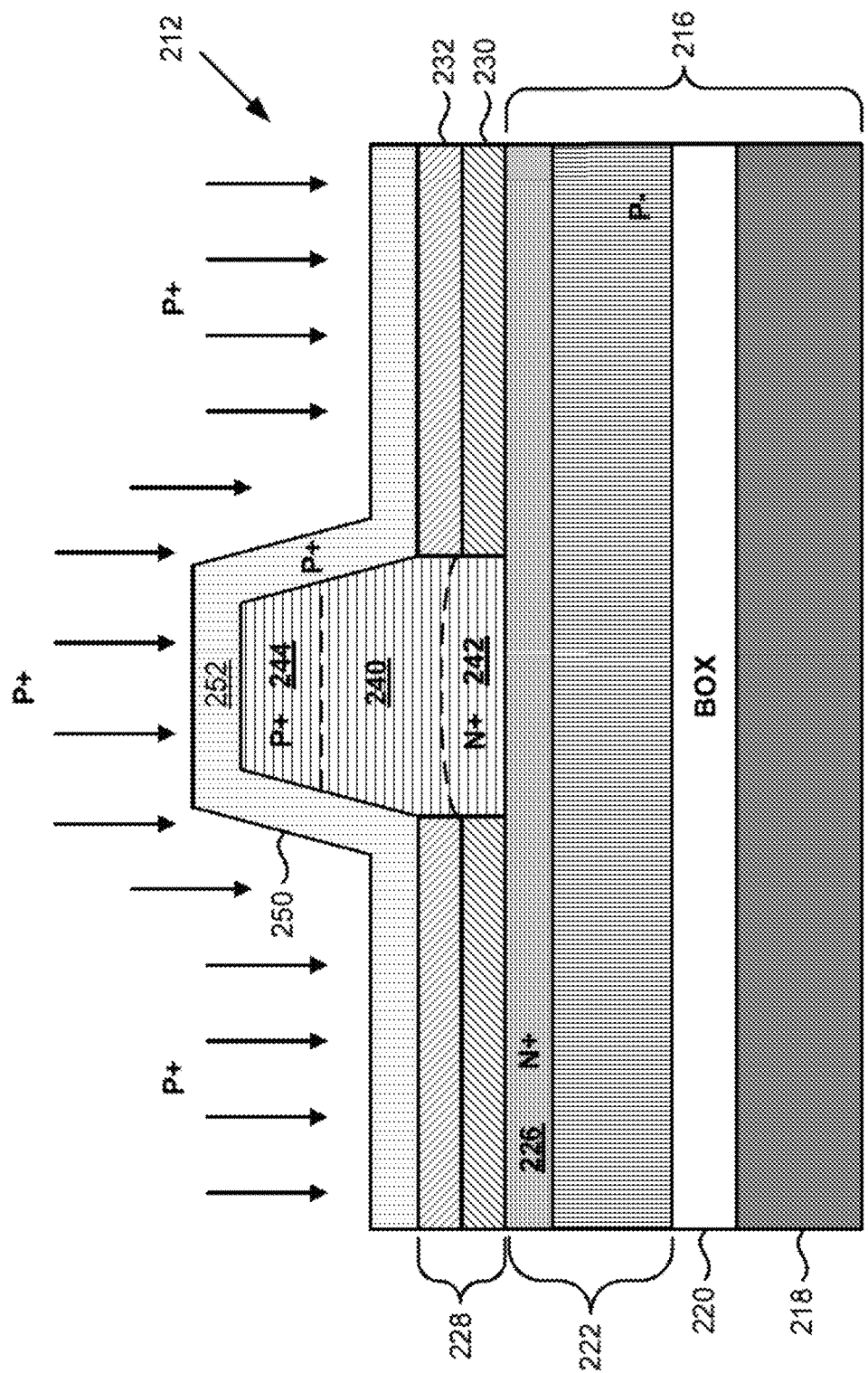
FIG. 2F shows a cross-sectional view of the exemplary structure of FIG. 2E at a subsequent fabrication stage according to the flowchart of FIG. 1.

Referring to structure 212, in FIG. 2F, flowchart 100 continues with implanting with P type dopants to form P type germanium region 244 in germanium structure 240 over N type germanium region 242, and P type silicon cap 252 over P type germanium region 244, where P type germanium region 244 is the anode of the photodiode being fabricated (action 112). According to the exemplary implementation shown in FIG. 2F, P type germanium region 244 and P type silicon cap 252 are highly doped to a P+ type dopant concentration. For example, in one implementation, P type silicon region 244 and P type silicon cap 252 may be doped with boron (B) to a dopant concentration of from approximately $10^{18}$ cm$^{-3}$ to approximately $10^{19}$ cm$^{-3}$.

It is noted that, in implementations in which germanium structure 240 undergoes annealing in action 110, that annealing occurs prior to implanting germanium structure 240 and blanket silicon layer 250 with P type dopants in action 112. It is further noted that the dopant implantation process used in action 112 may be performed using a high concentration of P type dopants but relatively low energy. As a result, implantation by P type dopants in action 112 will typically not affect the N type dopant profiles of N type silicon region 226 or N type germanium region 242. Moreover, due to the relatively low implantation energy used in action 112, the portion of germanium structure 240 situated above N type germanium region 242 and below P type germanium region 244 may be a substantially intrinsic (i.e. substantially undoped) germanium region, or may be a P− type region.

Figure 2G:
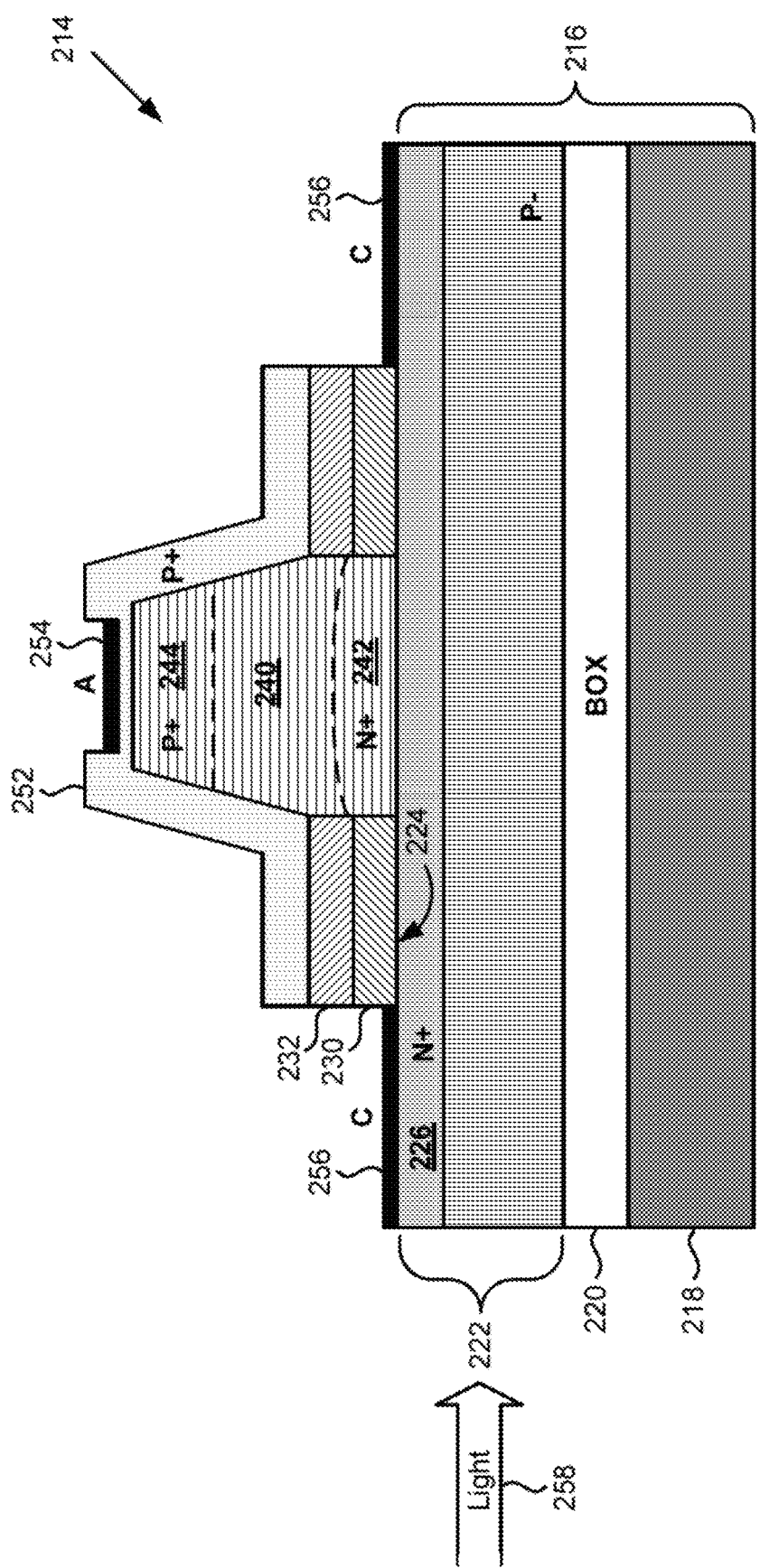
FIG. 2G shows a cross-sectional view of an exemplary germanium photodiode, according to one implementation.

Flowchart 100 can conclude with forming an anode contact and one or more cathode contacts of the photodiode (action 114). FIG. 2G shows photodiode 214 including anode contact 254 situated on P type silicon cap 252, and cathode contacts 256 situated on N type silicon region 226 of silicon substrate 222. Anode contact 252 and cathode contacts 256 may be metal or metal alloy contacts, such as cobalt/nickel alloy contacts, for example. It is noted that cathode contacts 256 may be electrically shorted to one another using metallization layer(s) during back end of line (BEOL) processing, as known in the art.

The transformation of structure 212, in FIG. 2F, to photodiode 214, in FIG. 2G may include several intermediate processing steps. For example, blanket silicon layer 250, and hard mask 228 may be selectively etched away to expose the portions of N type silicon region 226 that are covered by cathode contacts 256 in FIG. 2G, as well as to define P type silicon cap 252. Subsequently, a silicide blocking layer (not shown in the present figures) may be selectively formed over silicon cap 252. A window may be etched in the silicide blocking layer to reveal the portion of P type silicon cap 252 covered by anode contact 254 in FIG. 2G, and that portion of P type silicon cap 252 may be partially etched away. Then, a self-aligned silicidation process may be performed on the exposed portion of P type silicon cap 252, and on the exposed portions of N type silicon region 226 prior to formation of anode contact 254 and cathode contacts 256.

Thus, anode contact 254 and cathode contacts 256 may be silicided contacts, thereby improving the ohmic contact of anode contact 254 with P type silicon cap 252 and P type germanium region 244, and improving the ohmic contact of cathode contacts 256 with N type silicon region 226 of silicon substrate 222. Moreover, according to the exemplary implementation shown in FIG. 2G, N type silicon region 226 of silicon substrate 222, on which cathode contacts 256 of photodiode 214 are situated, is electrically connected to N type germanium region 242 that serves as the cathode of photodiode 214.

As shown in FIG. 2G, photodiode 214 is configured to detect light 258 entering silicon substrate 222 from the side. That is to say photodiode 214 is configured to detect light 258 entering silicon substrate 222 between buried insulator layer (or BOX) 220 and top surface 224 of silicon substrate 222. In some implementations, photodiode 214 may be configured to detect light 258 entering silicon substrate in a direction parallel to top surface 224 of silicon substrate 222. However, in other implementations, photodiode 214 may be configured to detect light 258 entering silicon substrate 222 in a direction approximately parallel to top surface 224 of silicon substrate 222.

Figure 3:
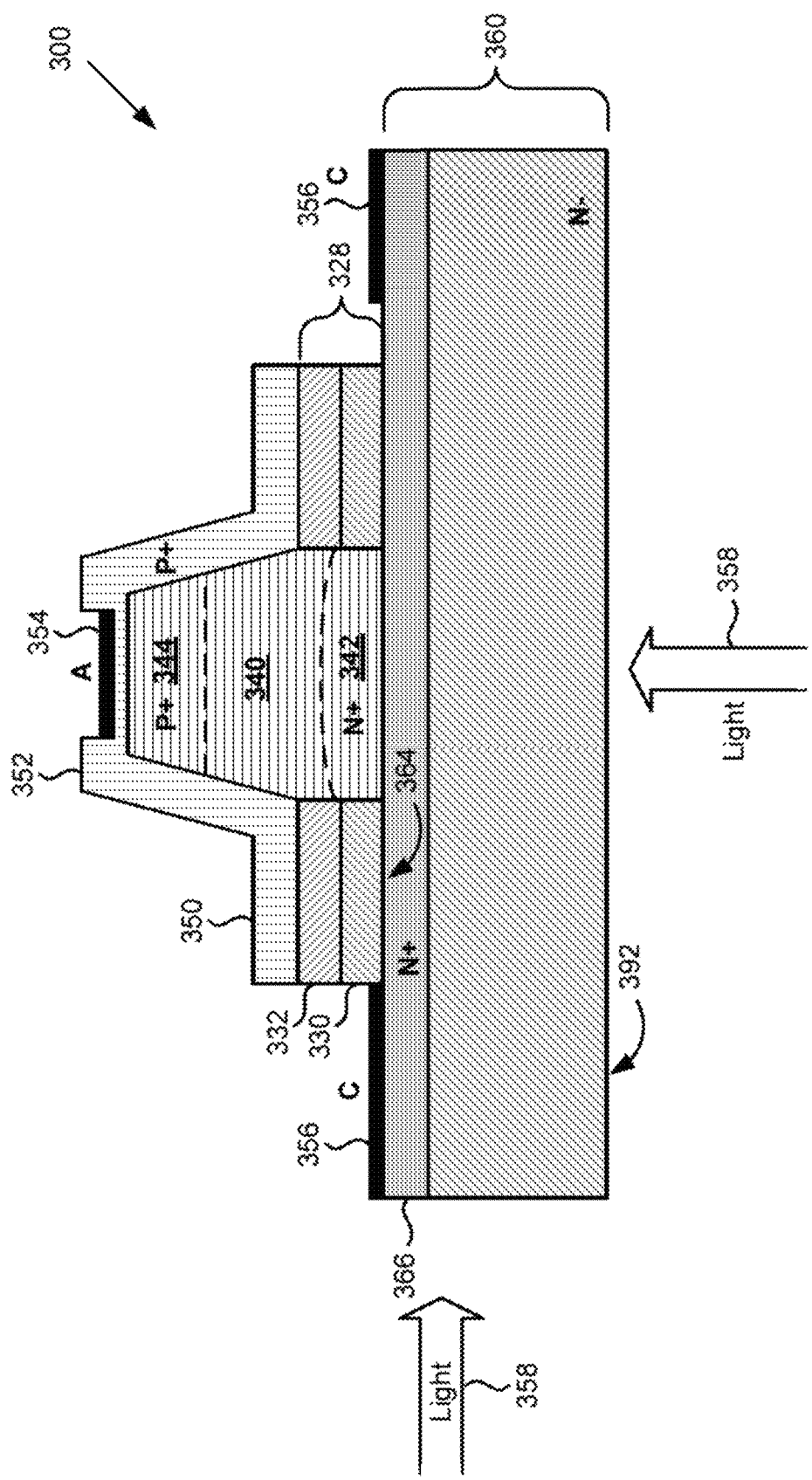
FIG. 3 shows a cross-sectional view of an exemplary germanium photodiode, according to another implementation.

FIG. 3 shows a cross-sectional view of an exemplary germanium photodiode, according to another implementation. As shown in FIG. 3, photodiode 300 includes silicon substrate 360, which may be formed of N type bulk silicon, such as N− type bulk silicon, having N type silicon region 366 extending from top surface 364 of silicon substrate 360 into an upper portion of silicon substrate 360. However, it is noted that in other implementations, silicon substrate 360 may be a P type substrate having N type silicon region 366 formed therein. Thus, silicon substrate 360 may be a bulk silicon layer of a bulk silicon device.

In addition to silicon substrate 360, photodiode 300 includes hard mask 328 disposed over silicon substrate 360. In some implementations, hard mask 328 may be formed as a multi-layer hard mask including lower dielectric layer 330 formed over silicon substrate 360 and upper dielectric layer 332 formed over lower dielectric layer 330. Photodiode 300 further includes germanium structure 340 including N type germanium region 342 serving as the cathode of photodiode 300, and P type germanium region 344, formed over N type germanium region 342 and serving as the anode of photodiode 300. Also shown in FIG. 3 are bottom surface 392 of silicon substrate 360, silicon layer 350 providing P type silicon cap 352 over germanium structure 340, anode contact 354 situated on P type silicon cap 352, and cathode contacts 356 situated on N type silicon region 366 of silicon substrate 360.

N type silicon region 366 may be formed as a highly doped N+ type region by ion implantation and thermal diffusion prior to formation of hard mask 328. For example, in one implementation, N type silicon region 366 may be doped with phosphorous (P) to a dopant concentration of from approximately $10^{18}$ cm$^{-3}$ to approximately $10^{19}$ cm$^{-3}$.

Lower dielectric layer 330 and upper dielectric layer 332 may be formed using any material and any technique typically employed in the art. For example, lower dielectric layer 330 may be formed of $SiO_2$, which may be deposited or thermally grown to produce lower dielectric layer 330. As another example, upper dielectric layer 332 may be formed of $Si_3N_4$, and, like lower dielectric layer 330, may be deposited or thermally grown.

Germanium structure 340 may be selectively formed on silicon substrate 360 within the confines of a photodiode window opened in hard mask 328, as discussed above by reference to photodiode 214. Germanium structure 340 may be formed to a thickness of up to approximately 400 nm, for example, over top surface 364 of silicon substrate 360. The selective formation of germanium structure 340 may be performed using any suitable techniques known in the art. For example, germanium structure 340 may be deposited or epitaxially grown using one of CVD or MBE. Alternatively, in some implementations, it may be advantageous or desirable to selectively form germanium structure 340 using one of ALD or LEPECVD.

As shown in FIG. 3, P type cap 352 is provided by conformal silicon layer 350 situated over germanium structure 340 and hard mask 328. It is noted that silicon layer 350 is formed in situ with respect to formation of germanium structure 340. That is to say, formation of germanium structure 340 and formation of silicon layer 340 may occur as a substantially continuous growth process in the same growth chamber. In some implementations, silicon layer 350 may be formed over germanium structure 340 and hard mask 328 to a thickness of approximately seventy nanometers 70 nm, for example. Silicon layer 350 may be formed using any suitable techniques known in the art. For example, silicon layer 350 may be formed using any one of CVD, MBE, ALD, or LEPECVD.

As further shown in FIG. 3, N type germanium region 342 of germanium structure 340 is a highly doped N+ type region. Formation of N type germanium region 342 may result from diffusion of N type dopants from N type silicon region 366. Diffusion of N type dopants from N type silicon region 366 into germanium structure 340 to form N type germanium region 342 may occur at any time during the selective formation of germanium structure 340 and/or the in situ formation of silicon layer 350. In some implementations, N type germanium region 342 may have an N type dopant concentration of from approximately $10^{18}$ cm$^{-3}$ to approximately $10^{19}$ cm$^{-3}$.

In some implementations, germanium structure 340 may be annealed in situ after formation of silicon layer 350. Annealing of germanium structure 340 may be performed in situ in the same growth chamber used during formation of germanium structure 340 and silicon layer 350. Annealing of germanium structure 340 may further promote formation of N type germanium region 342 in germanium structure 340 as N type dopants are thermally diffused from N type silicon region 366 into N type germanium region 342. That is to say, in some implementations, the formation of germanium structure 340, the formation of silicon layer 350, and the annealing of germanium structure 340 may be a substantially continuous process performed in situ, during which N type germanium region 342 is formed.

It is noted that the presence of silicon layer 350 providing P type silicon cap 352 over germanium structure 340 results in germanium structure 340, which provides the anode and the cathode of photodiode 300, being encapsulated. That is to say, germanium structure 340 is adjoined along the entirety of its bottom surface by top surface 364 of silicon substrate 360, along the entirety of its side surfaces by the combination of hard mask 328 and P type silicon cap 352, and along the entirety of its top surface by P type silicon cap 352.

The encapsulation of germanium structure 340 protects germanium structure 340 from thermal damage during annealing. Consequently, and despite the relatively low melting point of germanium, germanium structure 340 may be annealed at a temperature of approximately 850° C. Advantageously, annealing of germanium structure 340 substantially reduces dark current in photodiode 300. For example, the annealing of germanium structure 340 at a temperature of approximately 850° C. can reduce dark current in photodiode 300 by almost two orders of magnitude, i.e., from at least ten times to almost one hundred times, when compared to a photodiode in which a corresponding germanium structure is not annealed. In addition, encapsulation of germanium structure 340 prevents exposure of germanium structure 340 to harmful chemicals typically used during semiconductor device fabrication.

According to the exemplary implementation shown in FIG. 3, P type germanium region 344 and P type silicon cap 352 are highly doped to a P+ type dopant concentration. For example, in one implementation, P type silicon region 344 and P type silicon cap 352 may be doped with boron (B) to a dopant concentration of from approximately $10^{18}$ cm$^{-3}$ to approximately $10^{19}$ cm$^{-3}$.

It is noted that, in implementations in which germanium structure 340 is annealed as described above, that annealing occurs prior to implanting germanium structure 340 and silicon layer 350 with P type dopants. It is further noted that the dopant implantation process used to form P type germanium region 344 and P type silicon cap 352 may be performed using a high concentration of P type dopants but relatively low energy. As a result, implantation by P type dopants to form P type germanium region 344 and P type silicon cap 352 will typically not affect the N type dopant profiles of N type silicon region 366 or N type germanium region 342. Moreover, due to the relatively low implantation energy used to form P type germanium region 344 and P type silicon cap 352, the portion of germanium structure 340 situated above N type germanium region 342 and below P type germanium region 344 may be a substantially intrinsic (i.e. substantially undoped) germanium region, or may be a P– type region.

Anode contact 352 and cathode contacts 356 may be metal or metal alloy contacts, such as cobalt/nickel alloy contacts, for example. It is noted that cathode contacts 356 may be electrically shorted to one another using metallization layer(s) during BEOL processing, as known in the art. Anode contact 354 and cathode contacts 356 may be silicided contacts, thereby improving the ohmic contact of anode contact 354 with P type silicon cap 352 and P type germanium region 344, and improving the ohmic contact of cathode contacts 356 with N type silicon region 366 of silicon substrate 360. Moreover, according to the exemplary implementation shown in FIG. 3, N type silicon region 366 of silicon substrate 360, on which cathode contacts 356 of photodiode 300 are situated, is electrically connected to N type germanium region 342 that serves as the cathode of photodiode 300.

As shown in FIG. 3, photodiode 300 can be configured to detect light 358 entering silicon substrate 360 from the side or from bottom surface 392. That is to say photodiode 300 may be configured to detect light 358 entering silicon substrate 360 between bottom surface 392 and top surface 364 of silicon substrate 360, in a direction approximately parallel to top surface 364 and bottom surface 392. Alternatively, or in addition, photodiode 300 may be configured to detect light 358 entering silicon substrate 360 through bottom surface 392 of silicon substrate 360, in a direction approximately perpendicular to top surface 364 and bottom surface 392.

Figure 4:
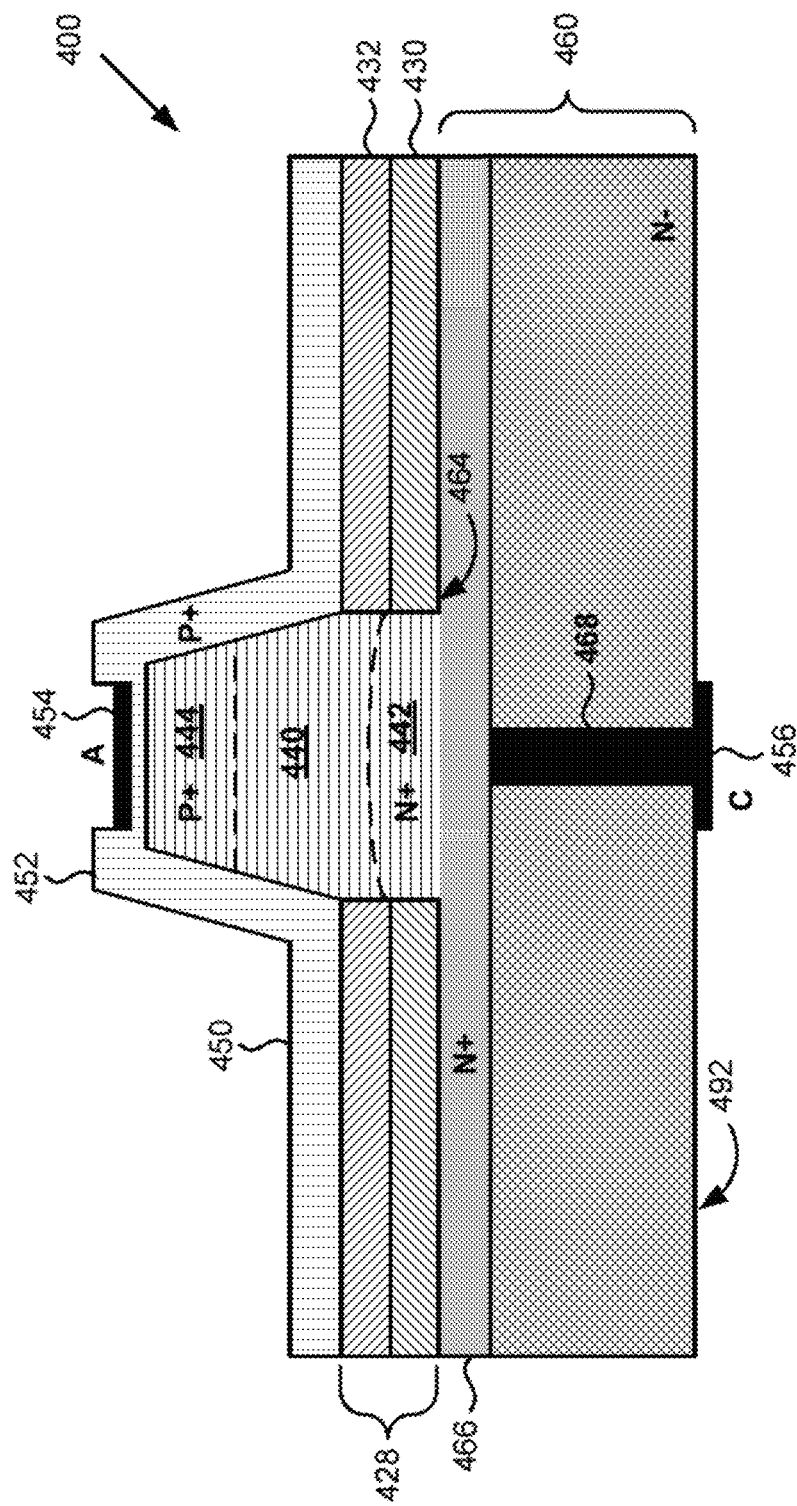
FIG. 4 shows a cross-sectional view of an exemplary germanium photodiode, according to yet another implementation.

FIG. 4 shows a cross-sectional view of an exemplary germanium photodiode, according to yet another implementation. As shown in FIG. 4, photodiode 400 includes silicon substrate 460, which may be formed of N type bulk silicon, such as N– type bulk silicon, having N type silicon region 466 extending from top surface 464 of silicon substrate 460 into an upper portion of silicon substrate 460. However, it is noted that in other implementations, silicon substrate 460 may be a P type substrate having N type silicon region 466 formed therein. Thus, silicon substrate 460 may be a bulk silicon layer of a bulk silicon device.

In addition to silicon substrate 460, photodiode 400 includes hard mask 428 disposed over silicon substrate 460. In some implementations, hard mask 428 may be formed as a multi-layer hard mask including lower dielectric layer 430 formed over silicon substrate 460 and upper dielectric layer 432 formed over lower dielectric layer 430. Photodiode 400 further includes germanium structure 440 including N type germanium region 442 serving as the cathode of photodiode 400, and P type germanium region 444, formed over N type germanium region 442 and serving as the anode of photodiode 400. Also shown in FIG. 4 are blanket silicon layer 450 providing P type silicon cap 452 over germanium structure 440, anode contact 454 situated on P type silicon cap 452, cathode contact 456 situated on bottom surface 492 of silicon substrate 460, and through-substrate via (TSV) 468 electrically connecting cathode contact 456 to N type silicon region 466 of silicon substrate 460.

N type silicon region 466 may be formed as a highly doped N+ type region by ion implantation and thermal diffusion prior to formation of hard mask 428. For example, in one implementation, N type silicon region 466 may be doped with phosphorous (P) to a dopant concentration of from approximately $10^{18}$ cm$^{-3}$ to approximately $10^{19}$ cm$^{-3}$.

Lower dielectric layer 430 and upper dielectric layer 432 may be formed using any material and any technique typically employed in the art. For example, lower dielectric layer 430 may be formed of $SiO_2$, which may be deposited or thermally grown to produce lower dielectric layer 430. As another example, upper dielectric layer 432 may be formed of $Si_3N_4$, and, like lower dielectric layer 430, may be deposited or thermally grown.

Germanium structure 440 may be selectively formed on silicon substrate 460 within the confines of a photodiode window opened in hard mask 428, as discussed above by reference to photodiode 214. Germanium structure 440 may be formed to a thickness of up to approximately 400 nm, for example, over top surface 464 of silicon substrate 460. The selective formation of germanium structure 440 may be performed using any suitable techniques known in the art. For example, germanium structure 440 may be deposited or epitaxially grown using one of CVD or MBE. Alternatively, in some implementations, it may be advantageous or desirable to selectively form germanium structure 440 using one of ALD or LEPECVD.

As shown in FIG. 4, P type cap 452 is provided by blanket silicon layer 450 situated over germanium structure 440 and hard mask 428. It is noted that blanket silicon layer 450 is formed in situ with respect to formation of germanium structure 440. That is to say, formation of germanium structure 440 and formation of blanket silicon layer 440 may occur as a substantially continuous growth process in the same growth chamber. In some implementations, blanket silicon layer 450 may be formed over germanium structure 440 and hard mask 428 to a thickness of approximately seventy nanometers 70 nm, for example. Blanket silicon layer 450 may be formed using any suitable techniques known in the art. For example, blanket silicon layer 450 may be formed using any one of CVD, MBE, ALD, or LEPECVD.

As further shown in FIG. 4, N type germanium region 442 of germanium structure 440 is a highly doped N+ type region. Formation of N type germanium region 442 may result from diffusion of N type dopants from N type silicon region 466. Diffusion of N type dopants from N type silicon region 466 into germanium structure 440 to form N type germanium region 442 may occur at any time during the selective formation of germanium structure 440 and/or the in situ formation of blanket silicon layer 450. In some implementations, N type germanium region 442 may have an N type dopant concentration of from approximately $10^{18}$ cm$^{-3}$ to approximately $10^{19}$ cm$^{-3}$.

In some implementations, germanium structure 440 may be annealed in situ after formation of blanket silicon layer 450. Annealing of germanium structure 440 may be performed in situ in the same growth chamber used during formation of germanium structure 440 and blanket silicon layer 450. Annealing of germanium structure 440 may further promote formation of N type germanium region 442 in germanium structure 440 as N type dopants are thermally diffused from N type silicon region 466 into N type germanium region 442. That is to say, in some implementations, the formation of germanium structure 440, the formation of blanket silicon layer 450, and the annealing of germanium structure 440 may be a substantially continuous process performed in situ, during which N type germanium region 442 is formed.

It is noted that the presence of blanket silicon layer 450 providing P type silicon cap 452 over germanium structure 440 results in germanium structure 440, which provides the anode and the cathode of photodiode 400, being encapsulated. That is to say, germanium structure 440 is adjoined along the entirety of its bottom surface by top surface 464 of silicon substrate 460, along the entirety of its side surfaces by the combination of hard mask 428 and P type silicon cap 452, and along the entirety of its top surface by P type silicon cap 452.

The encapsulation of germanium structure 440 protects germanium structure 440 from thermal damage during annealing. Consequently, and despite the relatively low melting point of germanium, germanium structure 440 may be annealed at a temperature of approximately 850° C. Advantageously, annealing of germanium structure 440 substantially reduces dark current in photodiode 400. For example, the annealing of germanium structure 440 at a temperature of approximately 850° C. can reduce dark current in photodiode 400 by almost two orders of magnitude, i.e., from at least ten times to almost one hundred times, when compared to a photodiode in which a corresponding germanium structure is not annealed. In addition, encapsulation of germanium structure 440 prevents exposure of germanium structure 440 to harmful chemicals typically used during semiconductor device fabrication.

According to the exemplary implementation shown in FIG. 4, P type germanium region 444 and P type silicon cap 452 are highly doped to a P+ type dopant concentration. For example, in one implementation, P type silicon region 444 and P type silicon cap 452 may be doped with boron (B) to a dopant concentration of from approximately $10^{18}$ cm$^{-3}$ to approximately $10^{19}$ cm$^{-3}$.

It is noted that, in implementations in which germanium structure 440 is annealed as described above, that annealing occurs prior to implanting germanium structure 440 and silicon layer 450 with P type dopants. It is further noted that the dopant implantation process used to form P type germanium region 444 and P type silicon cap 452 may be performed using a high concentration of P type dopants but relatively low energy. As a result, implantation by P type dopants to form P type germanium region 444 and P type silicon cap 452 will typically not affect the N type dopant profiles of N type silicon region 466 or N type germanium region 442. Moreover, due to the relatively low implantation energy used to form P type germanium region 444 and P type silicon cap 452, the portion of germanium structure 440 situated above N type germanium region 442 and below P type germanium region 444 may be a substantially intrinsic (i.e. substantially undoped) germanium region, or may be a P– type region.

Anode contact 452 and cathode contact 456 may be metal or metal alloy contacts, such as cobalt/nickel alloy contacts, for example. Anode contact 454 and cathode contact 456 may be silicided contacts. Moreover, according to the exemplary implementation shown in FIG. 4, N type silicon region 466 of silicon substrate 460, to which cathode contact 456 of photodiode 400 is electrically connected by TSV 468, is itself electrically connected to N type germanium region 442 that serves as the cathode of photodiode 400.

Thus, the present application discloses germanium photodiodes and methods for their fabrication. Such a germanium photodiode includes a silicon cap formed over a germanium structure providing the anode and the cathode of the photodiode. By forming the silicon cap over the germanium structure prior to annealing, the present solution advantageously enables a significant reduction in dark current in the photodiode while providing thermal protection for the germanium structure. In addition, the silicon cap prevents the germanium structure from being exposed to harmful chemicals used during device fabrication. The silicon cap, in combination with a silicon substrate of the photodiode, further advantageously enables formation of self-aligned silicided anode and cathode contacts.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A photodiode comprising:
a top silicon layer in a silicon-on-insulator (SOI) device;
an N type germanium region situated over said top silicon layer, said N type germanium region being a cathode of said photodiode;
a P type germanium region situated over said N type germanium region, said P type germanium region being an anode of said photodiode;
a P type silicon cap over said P type germanium region;
a cathode contact of said photodiode being situated on an N type region of said top silicon layer that is electrically connected to said N type germanium region of said photodiode.

2. The photodiode of claim 1, further comprising an anode contact of said photodiode being situated on said P type silicon cap.

3. The photodiode of claim 2, wherein said anode contact and said cathode contact are silicided contacts.

4. The photodiode of claim 2, wherein said anode contact is situated in a partially etched portion of said P type silicon cap.

5. The photodiode of claim 1, wherein said top silicon layer is a P type or an N type top silicon layer, and said N type region of said top silicon layer is an N+ type region.

6. The photodiode of claim 1, wherein said N type germanium region is an N+ type germanium region, said P type germanium region is a P+ type germanium region, and said P type silicon cap is a P+ type silicon cap.

7. A photodiode comprising:
a bulk silicon layer in a bulk silicon device, wherein said bulk silicon layer is an N type bulk silicon layer;
an N type germanium region situated over said N type bulk silicon layer, said N type germanium region being a cathode of said photodiode;
a P type germanium region situated over said N type germanium region, said P type germanium region being an anode of said photodiode;
a P type silicon cap over said P type germanium region;
a cathode contact of said photodiode being situated on an N type region of said N type bulk silicon layer that is electrically connected to said N type germanium region of said photodiode.

8. The photodiode of claim 7, further comprising an anode contact of said photodiode being situated on said P type silicon cap.

9. The photodiode of claim 8, wherein said anode contact and said cathode contact are silicided contacts.

10. The photodiode of claim 8, wherein said anode contact is situated in a partially etched portion of said P type silicon cap.

11. The photodiode of claim 7, wherein said N type bulk silicon layer is and N− type bulk silicon layer, and said N type region is an N+ type region.

12. The photodiode of claim 7, wherein said N type germanium region is an N+ type germanium region, said P type germanium region is a P+ type germanium region, and said P type silicon cap is a P+ type silicon cap.

13. A photodiode comprising:
   a bulk silicon layer in a bulk silicon device, wherein said bulk silicon layer is an N type bulk silicon layer;
   an N type germanium region situated over said N type bulk silicon layer, said N type germanium region being a cathode of said photodiode;
   a P type germanium region situated over said N type germanium region, said P type germanium region being an anode of said photodiode;
   a P type silicon cap over said P type germanium region;
   a cathode contact of said photodiode being situated on a bottom of said N type bulk silicon layer.

14. The photodiode of claim 13, further comprising an anode contact of said photodiode being situated on said P type silicon cap.

15. The photodiode of claim 14, wherein said anode contact and said cathode contact are silicided contacts.

16. The photodiode of claim 14, wherein said anode contact is situated in a partially etched portion of said P type silicon cap.

17. The photodiode of claim 13, further comprising a through-substrate via (TSV) electrically connecting said cathode contact to an N type region of said N type bulk silicon layer.

18. The photodiode of claim 17, wherein said N type bulk silicon layer is and N− type bulk silicon layer, and said N type region is an N+ type region.

19. The photodiode of claim 13, wherein said N type germanium region is an N+ type germanium region, said P type germanium region is a P+ type germanium region, and said P type silicon cap is a P+ type silicon cap.

\* \* \* \* \*